United States Patent

Yusuf

(10) Patent No.: US 12,476,612 B2
(45) Date of Patent: Nov. 18, 2025

(54) BRIDGE-T FILTER

(71) Applicant: Qorvo US, Inc., Greensboro, NC (US)

(72) Inventor: Yazid Yusuf, Orlando, FL (US)

(73) Assignee: Qorvo US, Inc., Greensboro, NC (US)

( * ) Notice: Subject to any disclaimer, the term of this patent is extended or adjusted under 35 U.S.C. 154(b) by 284 days.

(21) Appl. No.: 18/131,403

(22) Filed: Apr. 6, 2023

(65) Prior Publication Data

US 2023/0378936 A1 Nov. 23, 2023

Related U.S. Application Data

(60) Provisional application No. 63/364,851, filed on May 17, 2022.

(51) Int. Cl.
*H03H 9/54* (2006.01)
*H03H 9/64* (2006.01)

(52) U.S. Cl.
CPC .............. *H03H 9/542* (2013.01); *H03H 9/64* (2013.01)

(58) Field of Classification Search
CPC ......... H03H 9/542; H03H 9/64; H03H 7/1708
See application file for complete search history.

(56) References Cited

U.S. PATENT DOCUMENTS

| | | | | |
|---|---|---|---|---|
| 3,731,230 A | * | 5/1973 | Cerny, Jr. | H03B 5/362 331/116 R |
| 3,875,533 A | * | 4/1975 | Irwin | H03B 5/362 331/116 R |
| 5,291,459 A | * | 3/1994 | Andersen | H04B 11/00 367/134 |
| 9,837,984 B2 | * | 12/2017 | Khlat | H03H 9/605 |
| 2016/0191016 A1 | | 6/2016 | Khlat et al. | |

OTHER PUBLICATIONS

Mason, W.P., "Resistance Compensated Band-Pass Crystal Filters for Use in Unbalanced Circuits," The Bell System Technical Journal, vol. XVI, No. 4, Oct. 1937, pp. 423-436.
Zverev, A.I., "Handbook of Filter Synthesis," 1967, John Wiley and Sons, Inc., pp. 421-440.

\* cited by examiner

*Primary Examiner* — Andrea Lindgren Baltzell
*Assistant Examiner* — Kimberly E Glenn
(74) *Attorney, Agent, or Firm* — Withrow & Terranova, P.L.L.C.

(57) ABSTRACT

A bridge-T filter is disclosed. In one aspect, the bridge-T filter may include one or more inductors associated with acoustic resonators to assist in providing out-of-band rejection while improving fractional bandwidth of the filter. In specific aspects, the additional inductors may be placed in series or parallel to the acoustic resonators. The improved fractional bandwidth and better out-of-band rejection reduces unwanted signals and improves the user experience.

18 Claims, 3 Drawing Sheets

BRIDGE-T FILTER

PRIORITY CLAIM

The present application claims priority to U.S. Provisional Patent Application Ser. No. 63/364,851 filed on May 17, 2022, and entitled "BRIDGE-T FILTER," the contents of which are incorporated herein by reference in its entirety.

BACKGROUND

I. Field of the Disclosure

The technology of the disclosure relates generally to passband filters for use in communication circuits.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. With the advent of the myriad functions available to such devices, there has been increased pressure to find ways to increase bandwidth available to transmit and receive data. At least partly responsive to such pressures, more recent cellular standards such as fifth generation—new radio (5G-NR) have moved to higher frequencies. These higher frequencies still require filtering to reject unwanted signals. Traditional filters may provide incomplete out-of-band rejection characteristics, and thus, the shift to higher frequencies provides opportunities for innovation.

SUMMARY

Aspects disclosed in the detailed description include a bridge-T filter. In a particular aspect, the bridge-T filter may include one or more inductors associated with acoustic resonators to assist in providing out-of-band rejection while improving fractional bandwidth of the filter. In specific aspects, the additional inductors may be placed in series or parallel to the acoustic resonators. The improved fractional bandwidth and better out-of-band rejection reduces unwanted signals and improves the user experience.

In this regard in one aspect, a filter is disclosed. The filter comprises a first inductor coupled to a first node. The filter also comprises a second inductor serially coupled to the first inductor and a second node. An intermediate node is provided between the first inductor and the second inductor. The filter also comprises a first acoustic resonator coupled to the first node and the second node electrically parallel to the first inductor and the second inductor. The filter also comprises a second acoustic resonator coupled to the intermediate node and a ground. The filter also comprises a third inductor coupled to the intermediate node and the ground.

In another aspect, a filter is disclosed. The filter comprises a first inductor coupled to a first node. The filter also comprises a second inductor serially coupled to the first inductor and a second node. An intermediate node is provided between the first inductor and the second inductor. The filter also comprises a first acoustic resonator coupled to the second node. The filter also comprises a third inductor serially positioned between the first node and the first acoustic resonator. The filter also comprises a second acoustic resonator coupled to the intermediate node and a ground.

DETAILED DESCRIPTION

Figure 1A:
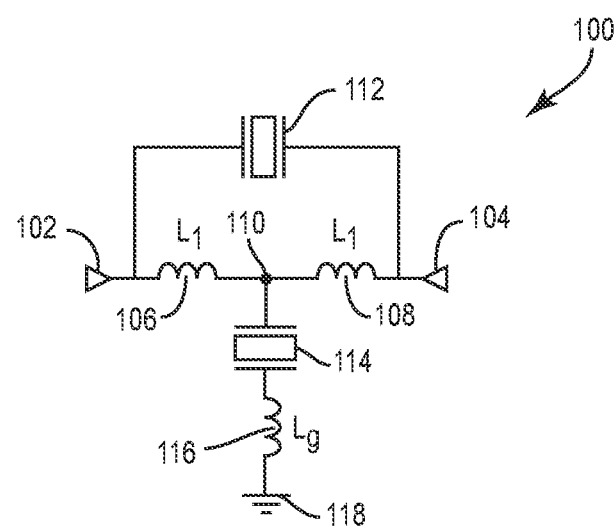
FIG. 1A is a circuit diagram of a conventional bridge-T filter.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a bridge-T filter. In a particular aspect, the bridge-T filter may include one or more inductors associated with acoustic resonators to assist in providing out-of-band rejection while improving fractional bandwidth of the filter. In specific aspects, the additional inductors may be placed in series or parallel to the acoustic resonators. The improved fractional bandwidth and better out-of-band rejection reduces unwanted signals and improves the user experience.

Figure 1B:
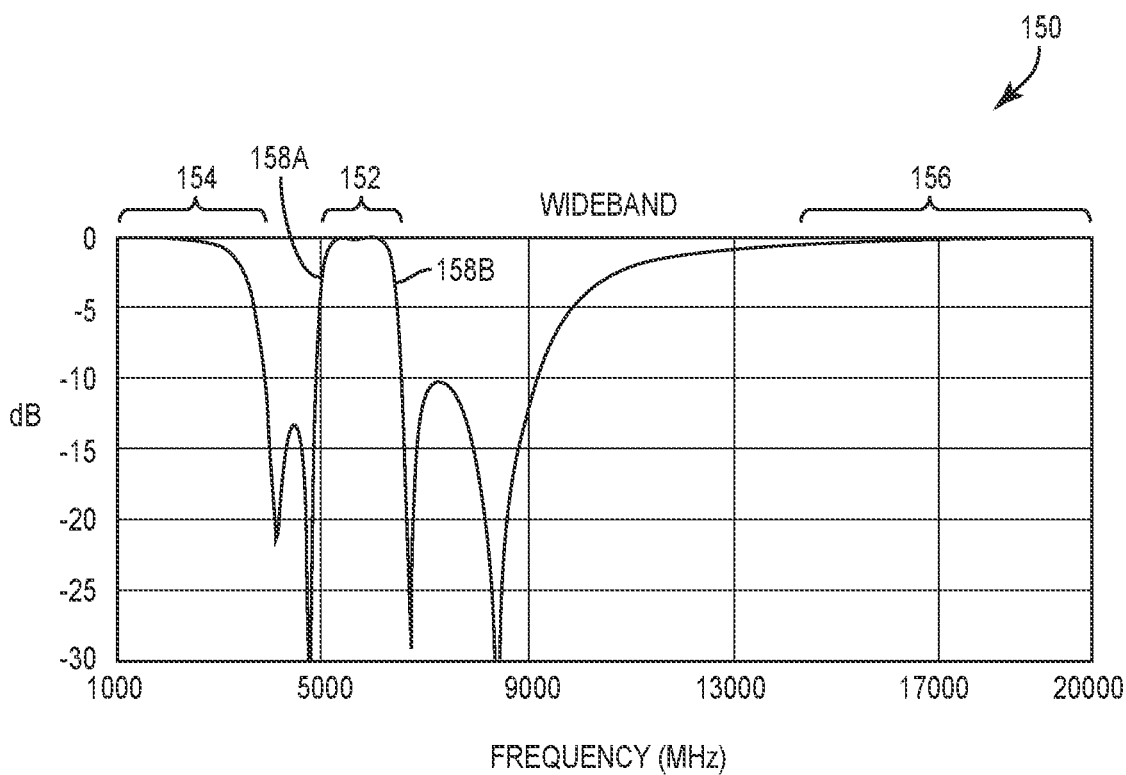
FIG. 1B is a graph showing the frequency response of the bridge-T filter of FIG. 1A.

Before addressing the particulars of the present disclosure, an overview of a conventional filter is provided in FIG. 1A along with a discussion of some of its shortcomings with reference to the frequency response graph of FIG. 1B. A discussion of exemplary aspects of the present disclosure begins below with reference to FIG. 2A.

In this regard, FIG. 1A is circuit diagram of a conventional bridge-T filter 100. The bridge-T filter 100 has an input node 102 and an output node 104. A first inductor 106 is coupled to the input node 102. A second inductor 108 is coupled to the first inductor 106 and the output node 104. Traditionally, the first inductor 106 and the second inductor 108 may have the same inductance (e.g., both have an inductance of $L_1$) and may be mutually positively coupled. An intermediate node 110 exists between the first inductor 106 and the second inductor 108. A first acoustic resonator 112 may be positioned in parallel to the first inductor 106 and the second inductor 108 between nodes 102 and 104. A second acoustic resonator 114 may be coupled to the intermediate node 110. A third inductor 116 (having an inductance of $L_g$) may be coupled the second acoustic resonator 114 to ground 118.

FIG. 1B shows a graph 150 showing the typical rejection characteristics of the bridge-T filter 100. Passband 152 may have a relatively large bandwidth with low insertion loss. However, this filter topology has poor rejection at low frequencies 154 and high frequencies 156. Likewise, the overall fractional bandwidth is generally limited to approximately twenty percent (20%). As used herein, fractional bandwidth is defined to be an absolute bandwidth divided by a center frequency, where the absolute bandwidth is defined by where the edges of the passband exceed three decibels (3 dB) down. Thus, as illustrated, the absolute bandwidth of the bridge-T filter 100 would be defined by the range between 158A and 158B (where the passband 152 exhibits a 3 dB drop).

One past approach to handling low and high frequencies is to add additional filtering stages. Such an approach adds cost, consumes more power, and imposes an area penalty on the overall device and, as a result, may be considered an undesirable solution. Exemplary aspects of the present disclosure modify and/or add inductors to the bridge-T filter to improve rejection at the low and high frequencies.

Figure 2A:
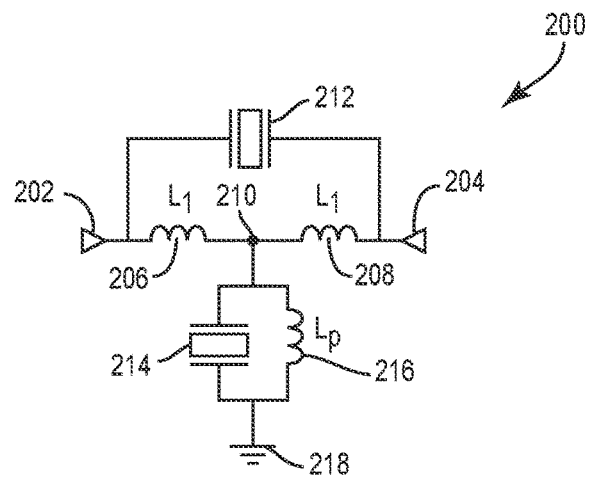
FIG. 2A is a circuit diagram of an exemplary bridge-T filter having an additional parallel inductor according to a first aspect of the present disclosure.

In particular, as illustrated in FIG. 2A, a bridge-T filter 200 according to an exemplary aspect of the present disclosure is illustrated. The bridge-T filter 200 has an input node 202 and an output node 204 (sometimes called first and second nodes). A first inductor 206 is coupled to the input node 202. A second inductor 208 is coupled to the first inductor 206 and the output node 204. The first inductor 206 and the second inductor 208 may have the same inductance (e.g., both have an inductance of $L_1$) and may be mutually positively coupled. An intermediate node 210 exists between the first inductor 206 and the second inductor 208. A first acoustic resonator 212 may be positioned in parallel to the first inductor 206 and the second inductor 208 between nodes 202 and 204. A second acoustic resonator 214 may be coupled to the intermediate node 210 and a ground 218. A third inductor 216 (having an inductance of $L_p$) may be coupled from the intermediate node 210 to ground 218 in parallel to the second acoustic resonator 214. The acoustic resonators 212, 214 may be surface acoustic wave (SAW) resonators or bulk acoustic wave (BAW) resonators.

Figure 2B:
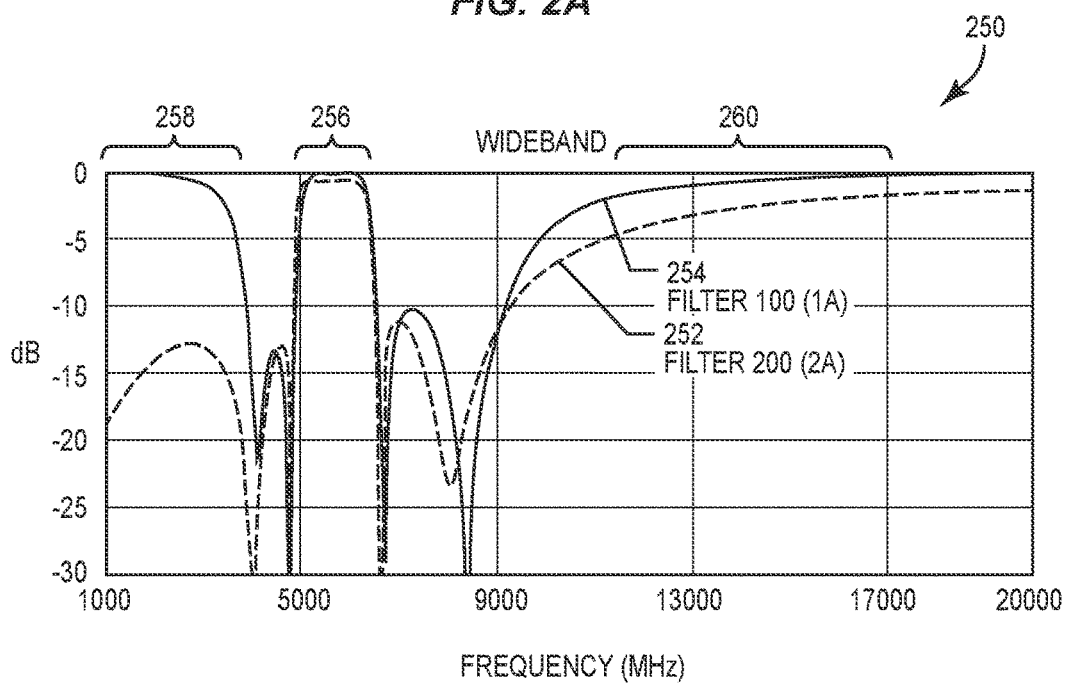
FIG. 2B is a graph showing the frequency response of the filter of FIG. 2A compared to the frequency response of the filter of FIG. 1A.

While not shown, the bridge-T filter 200 may be conceptualized or modeled as a lattice. The added shunt inductance of the third inductor 216 causes the reactance of the diagonal arm of the lattice to be inductive at low frequencies, which improves rejection as better seen in graph 250 of FIG. 2B. Dotted line 252 is the rejection characteristic of the bridge-T filter 200 of FIG. 2A while solid line 254 is the rejection characteristic of the bridge-T filter 100 of FIG. 1A. As can be seen, the passband 256 is generally the same, but substantial improvements are made in the rejection of low frequencies 258. Some improvement is made in the rejection of high frequencies 260.

Figure 3:
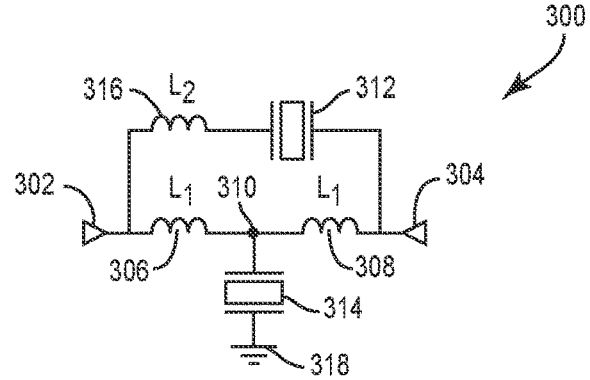
FIG. 3 is a circuit diagram of an exemplary bridge-T filter having an additional series inductor according to a second aspect of the present disclosure.

If rejection of the high frequencies is of greater concern, then a structure such as bridge-T filter 300, illustrated in FIG. 3 may be used. Specifically, the bridge-T filter 300 has an input node 302 and an output node 304 (sometimes called a first node and a second node). A first inductor 306 is coupled to the input node 302. A second inductor 308 is coupled to the first inductor 306 and the output node 304. The first inductor 306 and the second inductor 308 may have the same inductance (e.g., both have an inductance of $L_1$) and may be mutually positively coupled. An intermediate node 310 exists between the first inductor 306 and the second inductor 308. A first acoustic resonator 312 may be coupled to the output node 304. A third inductor 316 may be serially positioned between the first acoustic resonator 312 and the input node 302. The third inductor 316 may have an inductance denoted $L_2$. A second acoustic resonator 314 may be coupled to the intermediate node 310 and a ground 318.

The position of the third inductor 316 causes greater rejection of high frequencies, but has less impact on low frequencies.

The structure of the bridge-T filter 300 corresponds to adding inductance in series with the acoustic resonator in the series arm of the equivalent lattice structure.

Figure 4A:
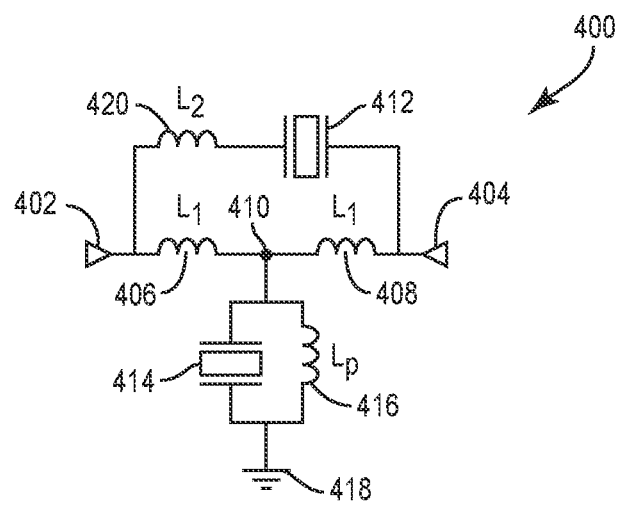
FIG. 4A is a circuit diagram of an exemplary bridge-T filter having both series and parallel additional inductors according to a third aspect of the present disclosure.

By combining the structures of the bridge-T filters 200 and 300, a more robust bridge-T filter 400 may be formed as illustrated in FIG. 4A. The bridge-T filter 400 has an input node 402 and an output node 404 (sometimes called a first node and a second node). A first inductor 406 is coupled to the input node 402. A second inductor 408 is coupled to the first inductor 406 and the output node 404. The first inductor 406 and the second inductor 408 may have the same inductance (e.g., both have an inductance of $L_1$) and may be mutually positively coupled. An intermediate node 410 exists between the first inductor 406 and the second inductor 408. A first acoustic resonator 412 may be coupled to the output node 404. A second acoustic resonator 414 may be coupled to the intermediate node 410 and a ground 418. A third inductor 416 (having an inductance of $L_p$) may be coupled from the intermediate node 410 to ground 418 in parallel to the second acoustic resonator 414. A fourth inductor 420 may be serially positioned between the first acoustic resonator 412 and the input node 402.

Figure 4B:
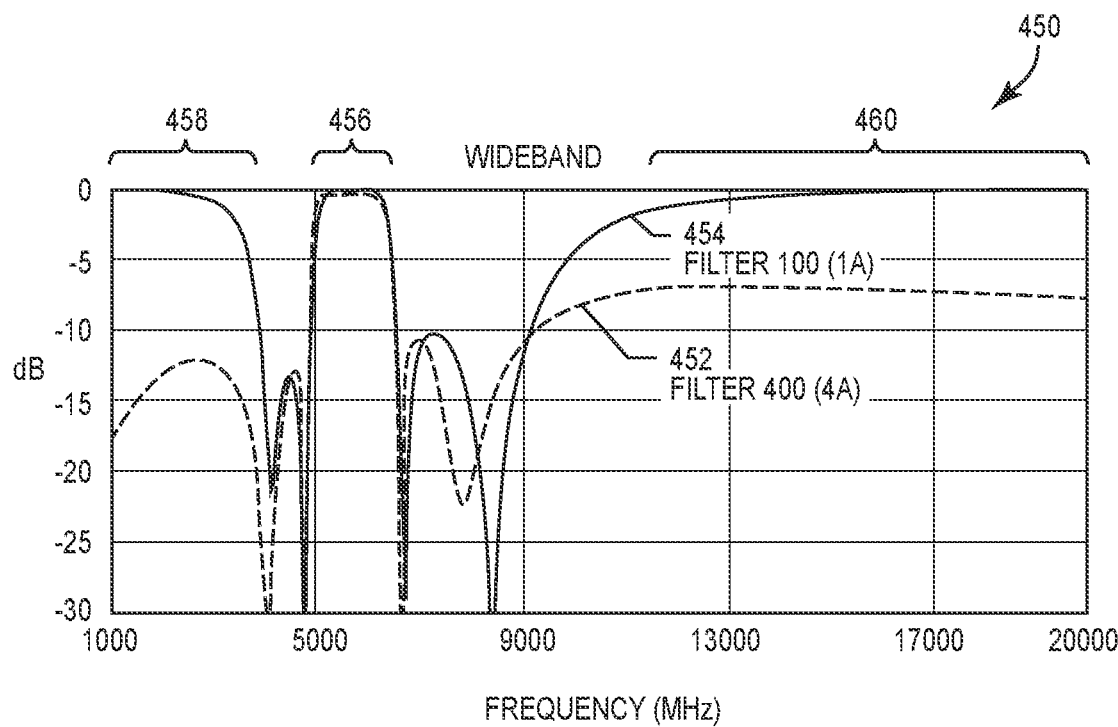
FIG. 4B is a graph showing the frequency response of the filter of FIG. 4A compared to the frequency response of the filter of FIG. 1A.

As explained above, and also with reference to graph 450 in FIG. 4B, the third inductor 416 parallel to the second acoustic resonator 414 may improve rejection of low frequencies 458 while the fourth inductor 420 serially positioned with the first acoustic resonator 412 may improve rejection of high frequencies 460. More specifically, a dotted line 452 is the rejection characteristic of the bridge-T filter 400 of FIG. 4A while solid line 454 is the rejection characteristic of the bridge-T filter 100 of FIG. 1A. As can be seen, the passband 456 is generally the same, but substantial improvements are made in the rejection of the low frequencies 458 and the high frequencies 260.

The structures of the bridge-T filters 200 and 400 allow substantially higher fractional bandwidths (e.g., over 30% and as high at 50+%) without the need for additional filter components. Filter 300 does not improve the bandwidth but does improve rejection at the higher frequencies. In contrast, the bridge-T filter 100 would require additional filtering such as a shunt inductor matching at input and output nodes and/or additional low-pass filtering. The resulting topologies of such a modified filter 100 would have increased complexity, increased component count, and require more total inductance (e.g., would consume more space and power).

It should be appreciated that the resonators of the present disclosure may be SAW or BAW as previously mentioned with reference to FIG. 2A.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A filter comprising:
a first inductor coupled to a first node;
a second inductor serially coupled to the first inductor and a second node, wherein an intermediate node is provided between the first inductor and the second inductor;
a first acoustic resonator coupled to the first node and the second node electrically parallel to the first inductor and the second inductor;
a second acoustic resonator coupled to the intermediate node and a ground; and
a third inductor coupled to the intermediate node and the ground, wherein the first inductor and the second inductor are positively mutually coupled.

2. The filter of claim 1, wherein the first inductor and the second inductor have the same inductance.

3. The filter of claim 1, wherein the third inductor and the second acoustic resonator are configured to cause the filter to reject low frequencies.

4. The filter of claim 1, wherein the filter has a passband with a fractional bandwidth greater than thirty percent.

5. The filter of claim 1, wherein the filter has a passband with a fractional bandwidth greater than forty percent.

6. The filter of claim 1, wherein the filter has a passband with a fractional bandwidth equal to or greater than fifty percent.

7. The filter of claim 1, wherein the first acoustic resonator comprises a surface acoustic wave (SAW) resonator.

8. The filter of claim 1, wherein the first acoustic resonator comprises a bulk acoustic wave (BAW) resonator.

9. A filter comprising:
a first inductor coupled to a first node;
a second inductor serially coupled to the first inductor and a second node, wherein an intermediate node is provided between the first inductor and the second inductor;
a first acoustic resonator coupled to the first node and the second node electrically parallel to thefirst inductor and the second inductor;
a second acoustic resonator coupled to the intermediate node and a ground; and
a third inductor coupled to the intermediate node and the ground, wherein the filter has a passband with a fractional bandwidth greater than thirty percent.

10. A filter comprising:
a first inductor coupled to a first node;
a second inductor serially coupled to the first inductor and a second node, wherein an intermediate node is provided between the first inductor and the second inductor;
a first acoustic resonator coupled to the second node;
a third inductor serially positioned between the first node and the first acoustic resonator; and a second acoustic resonator coupled to the intermediate node and a ground, wherein the third inductor and the second acoustic resonator are configured to cause the filter to reject low frequencies.

11. The filter of claim 10, further comprising a fourth inductor coupled to the intermediate node and the ground.

12. The filter of claim 10, wherein the first inductor and the second inductor are positively mutually coupled.

13. The filter of claim 10, wherein the first inductor and the second inductor have the same inductance.

14. The filter of claim 10, wherein the filter has a passband with a fractional bandwidth greater than thirty percent.

15. The filter of claim 10, wherein the filter has a passband with a fractional bandwidth greater than forty percent.

16. The filter of claim 10, wherein the filter has a passband with a fractional bandwidth equal to or greater than fifty percent.

17. The filter of claim 10, wherein the first acoustic resonator comprises a surface acoustic wave (SAW) resonator.

18. The filter of claim 10, wherein the first acoustic resonator comprises a bulk acoustic wave (BAW) resonator.

\* \* \* \* \*